(12) United States Patent
Tamai et al.

(10) Patent No.: US 7,743,488 B2
(45) Date of Patent: Jun. 29, 2010

(54) MANUFACTURING METHOD FOR VARIABLE RESISTIVE ELEMENT

(75) Inventors: Yukio Tamai, Tsuchiura (JP); Takuya Otabe, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 68 days.

(21) Appl. No.: 11/447,293

(22) Filed: Jun. 6, 2006

(65) Prior Publication Data

US 2006/0281277 A1    Dec. 14, 2006

(30) Foreign Application Priority Data

Jun. 10, 2005   (JP) .............................. 2005-170690

(51) Int. Cl.
*H01C 10/00*    (2006.01)
*H01C 17/00*    (2006.01)
*H01C 17/28*    (2006.01)

(52) U.S. Cl. ........................... 29/610.1; 29/621; 29/829; 29/874; 338/20

(58) Field of Classification Search ................ 29/610.1, 29/612, 616, 617, 619, 620, 829, 874; 216/41, 216/49, 67; 438/795; 204/192.17; 338/20
See application file for complete search history.

(56) References Cited

U.S. PATENT DOCUMENTS

| | | | | | |
|---|---|---|---|---|---|
| 1,979,820 | A | * | 11/1934 | Bowling ..................... | 148/626 |
| 3,553,533 | A | * | 1/1971 | Haberecht .................. | 361/783 |
| 4,510,178 | A | * | 4/1985 | Paulson et al. ............. | 29/610.1 |
| 5,318,723 | A | * | 6/1994 | Hashemi ................... | 252/519.1 |
| 5,668,437 | A | * | 9/1997 | Chadha et al. ............. | 313/495 |
| 6,204,139 | B1 | * | 3/2001 | Liu et al. .................... | 438/385 |
| 6,972,985 | B2 | * | 12/2005 | Rinerson et al. ............ | 365/148 |
| 7,029,982 | B1 | * | 4/2006 | Zhuang et al. .............. | 438/384 |

OTHER PUBLICATIONS

Cui et al., Hydrogen annealing effects on polycrystalline La0.67Ba0.33MnO3 compound, Journal of Magnetism and Magnetic Materials, vol. 297, Issue 1, Feb. 2006, pp. 21-25.*

Liu et al., *Electric-pulse-induced reversible resistance change effect in magnetoresistive films*, Applied Physics Letters, vol. 76, No. 19, May 8, 2000, pp. 2749-2751.

* cited by examiner

*Primary Examiner*—A. Dexter Tugbang
*Assistant Examiner*—Livius R Cazan
(74) *Attorney, Agent, or Firm*—Nixon & Vanderhye P.C.

(57) ABSTRACT

In the case where a variable resistive element, which is made of a variable resistor provided between a first and second electrodes, and of which the electrical resistance varies by applying a voltage pulse between the two electrodes, is applied to a resistance nonvolatile memory, there is a range of the resistance value of the variable resistive element in a low resistance state where the nonvolatile memory can operate normally. In the conventional manufacturing method the resistance value of the variable resistive element is too low, therefore, it can not be controlled within a desired range of the resistance value. A step of carrying out of a reduction process is provided at any point after the step of forming a variable resistor material as a film, it has thereby become possible to increase the resistance value of the variable resistive element, which is too low in the conventional method.

11 Claims, 14 Drawing Sheets

MANUFACTURING METHOD FOR VARIABLE RESISTIVE ELEMENT

CROSS REFERENCE TO RELATED APPLICATIONS

This Nonprovisional application claims priority under 35 U.S.C. §119(a) on Patent Applications No. 2005-170690 filed in Japan on 10 Jun., 2005, the entire contents of which are hereby incorporated by reference.

BACKGROUND

1. Field of the Technology

The present technology relates to a manufacturing method for a variable resistive element, which is made of a variable resistor provided between a first electrode and a second electrode, and of which the electrical resistance can be made to vary by applying a voltage pulse between the two electrodes.

2. Description of the Related Art

In recent years, a variety of device structures such as FeRAM's (Ferroelectric RAM's), MRAM's (Magnetic RAM's) and OUM's (Ovonic Unified Memories) have been proposed as a next generation nonvolatile random access memory (NVRAM) which can replace flash memory and can operate at a high speed, and are involved in severe competition for development in regards to enhancement in the performance, an increase in the reliability, reduction in cost and adjustment in the process. However, these memory devices at present respectively have advantages and disadvantages and an ideal "universal memory" having all the advantages of SRAM, DRAM and flash memory is still far from being implemented.

In comparison with these state of the art memory devices, a method for changing the electrical resistance in a reversible manner by applying a voltage pulse to a perovskite material, which is known as a colossal magnetoresistance effect, has been disclosed in the specification of U.S. Pat. No. 6,204,139 by Shangquing Liu, Alex Ignatiev et al. of Houston University in the U.S. and in "Electric-pulse-induced reversible resistance change effect in magnetoresistive films," Applied Physics Letter, Vol. 76, by Liu, S. Q. et al. pp. 2749-2751 in 2000. This technology is extremely groundbreaking in that it uses a perovskite material, which is known to have a colossal magnetoresistance effect and where a change in the resistance over several digits is exhibited at room temperature without applying a magnetic field. The structure of the variable resistive element which is shown in the specification of U.S. Pat. No. 6,204,139 has a lower electrode material that is made of a yttrium barium copper oxide, $YBa_2Cu_3O_7$ (YBCO), film which is deposited on a single crystal substrate made of a lanthanum aluminum oxide, $LaAlO_3$ (LAO), a variable resistor film that is made of a perovskite-type oxide made of a crystal praseodymium calcium manganese oxide, $Pr_{1-x}Ca_xMnO_3$ (PCMO), film and an upper electrode material made of an Ag film which is deposited by means of sputtering. In addition, it has been reported on the operation of this variable resistive element that the resistance can be changed in a reversible manner by applying a voltage pulse of plus or minus 51 volts between the upper and lower electrodes. A resistance random access memory (RRAM) which uses the operation of the reversible change in the resistance of this variable resistive element (hereinafter appropriately referred to as "switching operation") requires no magnetic field unlike MRAM, and therefore, has excellent properties such that power consumption is extremely low, miniaturization and increase in the integration are easy, and the dynamic range of the change in the resistance is significantly broad in comparison with MRAM, making multilevel storage possible.

In addition, as for the materials for a variable resistor, a ZnSe—Ge heterostructure and oxides of metals such as Ti, Nb, Hf, Zr, Ta, Ni, V, Zn, Sn, In, Th, and Al in addition to the above described perovskite materials are known as the materials which become a semiconductor when the composition ratio is off from the stoichiometric composition ratio, and of which the resistance value is variable depending on the applied voltage pulse conditions though it is at a small level.

An example of a conventional manufacturing method for this variable resistive element is described in the following.

FIG. 12 is a cross sectional diagram showing the basic structure of a variable resistive element. In addition, FIG. 13 is a flow chart showing the schematic manufacturing steps in accordance with a conventional manufacturing method for fabricating the variable resistive element.

This variable resistive element has a structure where a second electrode 1, which becomes a lower electrode, a variable resistor 2 and a first electrode 3 which becomes an upper electrode are layered sequentially in the direction perpendicular to the substrate. In addition, metal wires 6 are provided through contact holes 5 which are created in an interlayer insulating film 4 in order to apply a voltage pulse between the first electrode 3 and the second electrode 1.

The present Applicants fabricated a variable resistive element using, as an example of the variable resistor 2, a PCMO film which is an oxide having a perovskite-type structure and was formed so as to have a composition ratio of $Pr_{0.7}Ca_{0.3}MnO_3$ and a film thickness of 100 nm at a temperature for film formation of 500° C., and evaluated the properties thereof. FIG. 14 is a graph showing the change in the resistance value when a voltage pulse having the positive polarity (+2 V of the first electrode and 0 V of the second electrode) and the negative polarity (0 V of the first electrode and +2 V of the second electrode) with a pulse width of 100 nsec is alternately applied to this variable resistive element. The lateral axis indicates the number of applied pulses and the longitudinal axis indicates the resistance value that is read out along the logarithmic scale. As for the number of applied pulses, alternate applications of a voltage pulse having a negative polarity and a voltage pulse having a positive polarity are counted as one pulse. As shown in FIG. 14, a repeating switching operation was confirmed when the resistance value in a low resistance state was approximately $10^2 \Omega$ and the resistance value in a high resistance state was approximately $10^4 \Omega$. In addition, the ratio of the resistance value in the high resistance state to the resistance value in the low resistance state (hereinafter appropriately referred to as "switching ratio") is approximately 100, and thus the two resistance values are clearly distinguished.

In the case where this variable resistive element is applied to a resistance nonvolatile memory, there is a restriction in the resistance value of the variable resistive element, in particular, in the resistance value of the variable resistive element in the low resistance state as described in the following.

The data in the nonvolatile memory is determined by the level of the amount of current which flows through the variable resistive element that is selected at the time of readout (hereinafter appropriately referred to as "readout current"). In the case of the simplest binary memory, for example, the amount of the read out current differs between when the variable resistive element is in the low resistance state and in the high resistance state, and therefore, the voltage value that has been converted from the readout current of the selected variable resistive element and the reference voltage are compared using a sense amplifier circuit, and thereby, each piece of data is determined as a binary value "1" or "0." Here, in the case where the resistance value of the variable resistive element in the low resistance state is too high, the difference in the amount of the readout current between the time of the low resistance state and the high resistance state becomes small even when the switching ratio is sufficiently large, and therefore, the margin of the performance of the sense amplifier circuit becomes small and a problem arises where the data can not be correctly determined.

Meanwhile, in the case where the resistance of the variable resistive element is too low, the problem described below arises.

In a resistance nonvolatile memory using variable resistive elements, a number of variable resistive elements are connected to wires (so-called word lines and bit lines) for selecting a variable resistive element as a memory cell. When the resistance value of a variable resistive element becomes low, the amount of current that flows through an unselected variable resistive element other than the variable resistive element which is the selected memory cell increases in accordance with this low resistance, and therefore, the total amount of current which flows through the wires increases due to this extra current which flows through unselected variable resistive elements. When this total amount of current increases, the voltage drop along the wires increases, and therefore, in the particular case where the variable resistive element which is the selected memory cell is located at the end of the wires, the supplied voltage becomes insufficient and a problem arises where normal writing and readout operations can not be carried out.

Accordingly, the resistance value of the variable resistive element must be set within a predetermined range, in order to make the resistance nonvolatile memory operate normally. That is to say, the upper limit of the resistance value is limited by the performance of the sense amplifier which is determined by the configuration of the sense amplifier circuit, and the lower limit of the resistance value is determined by the number of cells in the variable resistive elements, which are memory cells connected to word lines and bit lines, the wire resistance of these lines and the current supplying performance of bank selecting transistors in the peripheral circuit connected to these lines.

Here, a case is assumed where a variable resistive element is applied to a certain example of a resistance nonvolatile memory (hereinafter, this nonvolatile memory is referred to as "nonvolatile memory A") which operates normally when the resistance value of the variable resistive element in the low resistance state is in a range from $10^3 \Omega$ to $10^5 \Omega$, and where it is more desirable for the resistance value to be approximately $10^4 \Omega$, taking inconsistencies in the reproducibility of the resistance value when the nonvolatile memory is fabricated into consideration. The range of resistance is determined by the specifications of design for each nonvolatile memory, as described above (in the nonvolatile memory A of the present example, the number of memory cells which are connected to the word lines and the bit lines is 128, and the peripheral circuit which includes a sense amplifier and bank selecting transistors is designed in accordance with a design rule of 0.25 μm).

In the above described conventional manufacturing method for a variable resistive element, however, the resistance value of the variable resistive element in the low resistance state becomes approximately $10^2 \Omega$, which is too low, and therefore, a sufficient readout voltage cannot be supplied to some selected cells, due to the voltage drop in the lines to which a number of variable resistive elements are connected, and thus, the data cannot be correctly read out.

As for the control means for raising a resistance vale of the variable resistive element which is too low to a desired range in the conventional manufacturing method, though there are methods such as reducing the area of the variable resistive element or increasing the film thickness of the variable resistor, any method can contribute to increasing the resistance value in a linear function, and therefore, it is difficult to increase the resistance value by approximately 1 to 2 digits as required in the present example.

In addition, though the resistance value of the variable resistive element can be increased by changing the conditions for the formation of a variable resistor film, for example, the material composition or the temperature for film formation, a sufficient switching ratio for separating the high resistance state and the low resistance state must be secured in addition to control over the resistance value, and therefore, optimization of these conditions is not easy.

Therefore, in view of the above described problems, an objects of the present invention is to provide a manufacturing method where the resistance value in the low resistance state of the variable resistive element can be controlled. In particular, an object of the invention to provide a manufacturing method where the resistance value of the variable resistive element, which is too low in accordance with the conventional manufacturing method, can be controlled to a desired resistance value without causing the switching ratio to decline.

SUMMARY OF THE INVENTION

Therefore, in view of the above described problems, a feature of an exemplary embodiment presented herein is to provide a manufacturing method where the resistance value in the low resistance state of the variable resistive element can be controlled. In particular, a feature of the exemplary embodiment to provide a manufacturing method where the resistance value of the variable resistive element, which is too low in accordance with the conventional manufacturing method, can be controlled to a desired resistance value without causing the switching ratio to decline.

SUMMARY

The Applicants found that the resistance value of a variable resistive element which is made of a variable resistor provided between a first electrode and a second electrode, and of which the electrical resistance can be made to vary by applying a voltage pulse between the two electrodes increases as a result of a reduction reaction involving the variable resistor. In addition, they also found that the resistance value further increases particularly when there is active hydrogen in atom form.

Thus, in order to achieve the above described features, a manufacturing method for a variable resistive element according to an exemplary embodiment is a manufacturing method for a variable resistive element which is made of a variable resistor provided between a first electrode and a second electrode, and of which the electrical resistance can be made to vary by applying a voltage pulse between the two electrodes, characterized by having a step of carrying out a reduction process on the variable resistor.

In addition, the manufacturing method for a variable resistive element according to an exemplary embodiment is characterized in that in the step of carrying out the reduction process on the variable resistor, a reduction reaction is induced using hydrogen in atom form.

In addition, the manufacturing method for a variable resistive element according to an exemplary embodiment is characterized in that in the step of carrying out the reduction process on the variable resistor, heat treatment is carried out in a reduction atmosphere including hydrogen.

In addition, the manufacturing method for a variable resistive element according to an exemplary embodiment is characterized in that in the heat treatment carried out in the reduction atmosphere including hydrogen, at least a variable resistor and a material functioning as a hydrogen catalyst are provided.

In addition, the manufacturing method for a variable resistive element according to an exemplary embodiment is characterized in that at least either the first electrode or the second electrode is made of a material functioning as a hydrogen catalyst.

In addition, the manufacturing method for a variable resistive element according to an exemplary embodiment is characterized in that a metal wire for applying a voltage pulse to the first electrode or the second electrode is made of a material functioning as a hydrogen catalyst.

In addition, the manufacturing method for a variable resistive element according to an exemplary embodiment is characterized by including a step of removing the material functioning as a hydrogen catalyst after the heat treatment in the reduction atmosphere including hydrogen.

In addition, the manufacturing method for a variable resistive element according to an exemplary embodiment is characterized by including a step of supplying hydrogen in atom form to a first semiconductor substrate having at least a variable resistor by simultaneously carrying out heat treatment on the first semiconductor substrate and a second semiconductor substrate having a material functioning as a hydrogen catalyst on the surface in an atmosphere including hydrogen.

In addition, the manufacturing method for a variable resistive element according to an exemplary embodiment is characterized in that the material functioning as a hydrogen catalyst is formed so as to include at least one type of metal atom selected from Ru, Rh, Pd, Ag, Os, Ir, Pt, Au, Mg, Ni, Cr, W and Ta.

In addition, the manufacturing method for a variable resistive element according to an exemplary embodiment is characterized in that the variable resistor is an oxide having a perovskite structure which is formed so as to include at least one type of element selected from Pr, Ca, La, Sr, Gd, Nd, Bi, Ba, Y, Ce, Pb, Sm and Dy, and at least one type of element selected from Ta, Ti, Cu, Mn, Cr, Co, Fe, Ni and Ga.

In addition, the manufacturing method for a variable resistive element according to an exemplary embodiment is characterized in that the variable resistor is an oxide having a basic perovskite structure which can be represented by any one of the following general formulas: $Pr_{1-X}Ca_X[Mn_{1-Z}M_Z]O_3$ (here, M may be any element selected from Ta, Ti, Cu, Cr, Co, Fe, Ni and Ga), $La_{1-X}AE_XMnO_3$ (here, AE may be any bivalent alkaline earth metal selected from Ca, Sr, Pb and Ba), $RE_{1-X}Sr_XMnO_3$ (here, Re may be any trivalent rare earth elements selected from Sm, La, Pr, Nd, Gd and Dy), $La_{1-X}Co_X[Mn_{1-Z}Co_Z]O_3$, $Gd_{1-X}Ca_XMnO_3$ and $Nd_{1-X}Gd_XMnO_3$ ($0 \leq X \leq 1$, $0 \leq Z < 1$).

In addition, the manufacturing method for a variable resistive element according to an exemplary embodiment is characterized in that the variable resistor is a metal oxide which has a ZnSe—Ge heterostructure or is formed so as to include at least one type of element selected from Ti, Nb, Hf, Zr, Ta, Ni, V, Zn, Sn, In, Th and Al.

In addition, the manufacturing method for a variable resistive element according to an exemplary embodiment is characterized in that the second electrode includes at least one type of material from single precious metals in the platinum group metals, alloys of which the base is a precious metal in the platinum group metals, oxide conductors made of a metal selected from Ir, Ru, Re and Os, and oxide conductors selected from strontium ruthenium oxide (SRO), lanthanum strontium cobalt oxide (LSCO) and yttrium barium copper oxide (YBCO).

In addition, the manufacturing method for a variable resistive element according to an exemplary embodiment is characterized in that the first electrode includes at least one type of material from precious metals in the platinum group metals, single metals selected from Ag, Al, Cu, Ni, Ti and Ta or alloys of these, oxide conductors made of a metal selected from Ir, Ru, Re and Os, and oxide conductors selected from strontium ruthenium oxide (SRO), lanthanum strontium cobalt oxide (LSCO) and yttrium barium copper oxide (YBCO).

In the manufacturing method for a variable resistive element according to an exemplary embodiment, where such a phenomenon that the resistance value of a variable resistive element increases as a result of a reduction reaction involving the variable resistor which has been found by the Applicants are used, the step of carrying out a reduction process on the variable resistor is provided at some point after the step of forming a variable resistor material as a film, and therefore, it has become possible to increase the resistance value of the variable resistive element, which is too low in accordance with the conventional manufacturing method.

In this step of carrying out a reduction process, the resistance value of the variable resistive element can be controlled to a desired resistance value by appropriately adjusting the steps that are applied and the conditions for processing. In addition, the resistance value of the variable resistive element can be controlled to a desired resistance value in a manufacturing method where an electrode material functioning as a hydrogen catalyst, a metal wire material and the like are used or a material functioning as a hydrogen catalyst is used.

In accordance with the manufacturing method according to an exemplary embodiment, it becomes possible to implement a resistance nonvolatile memory having a variable resistive element as a memory cell.

DETAILED DESCRIPTION

In the following, the embodiments of the manufacturing method for a variable resistive element are described in reference to the drawings.

First Embodiment

Figure 1:
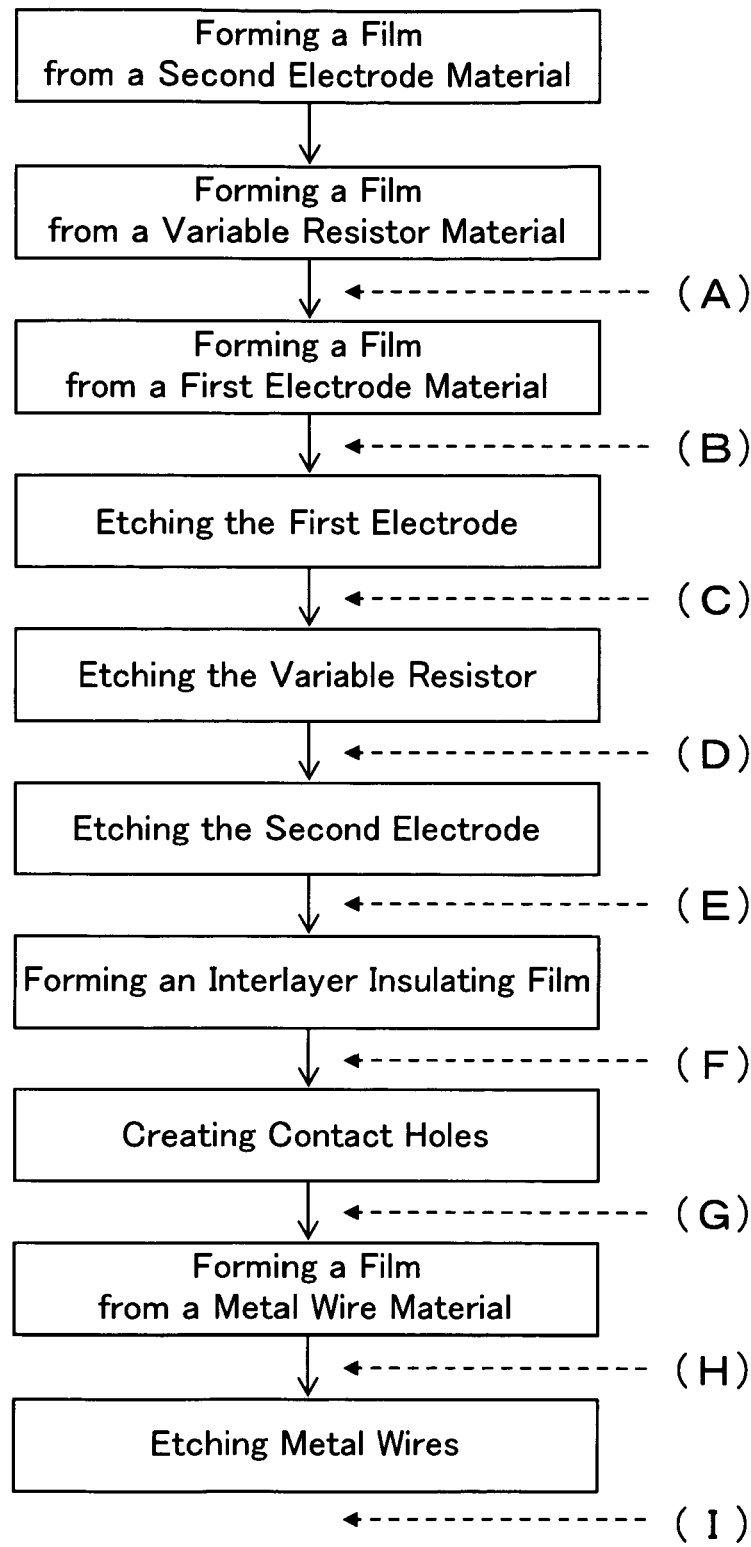
FIG. 1 is a flow chart showing the steps in the manufacture of the variable resistive element of FIG. 12 in accordance with an exemplary embodiment.
Figure 2:
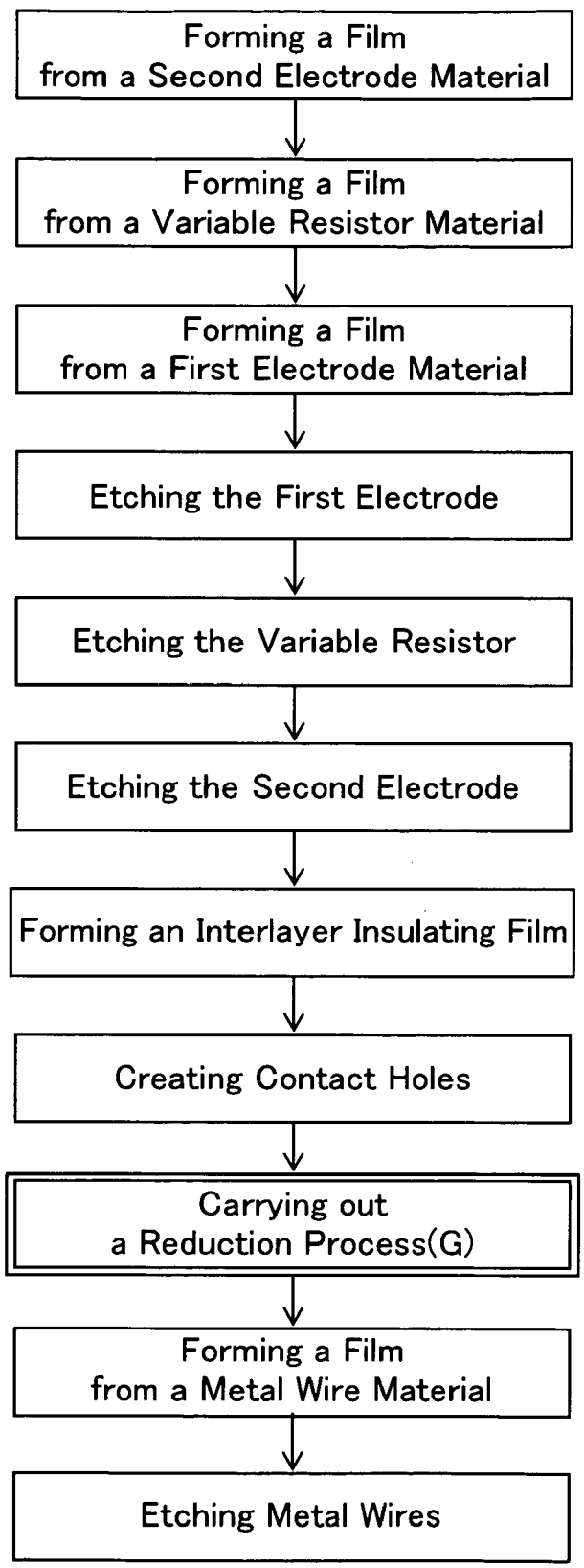
FIG. 2 is a flow chart showing the steps in an example of the manufacture of the variable resistive element of FIG. 12 in accordance with an exemplary embodiment.
Figure 12:
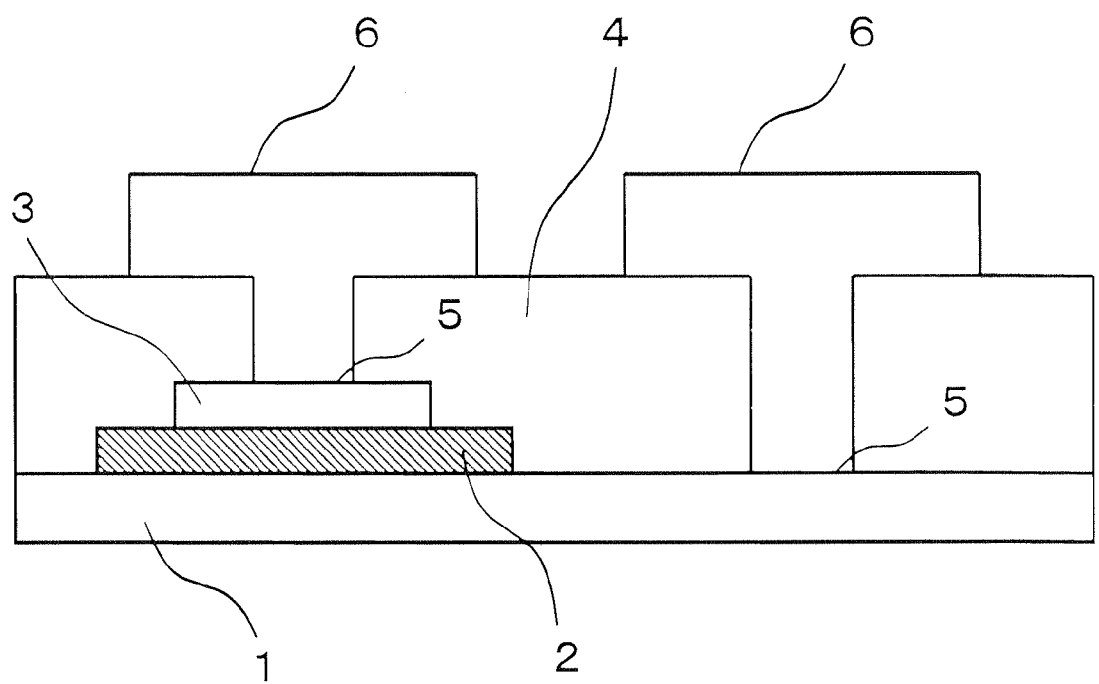
FIG. 12 is a perspective diagram showing the basic structure of a variable resistive element.
Figure 13:
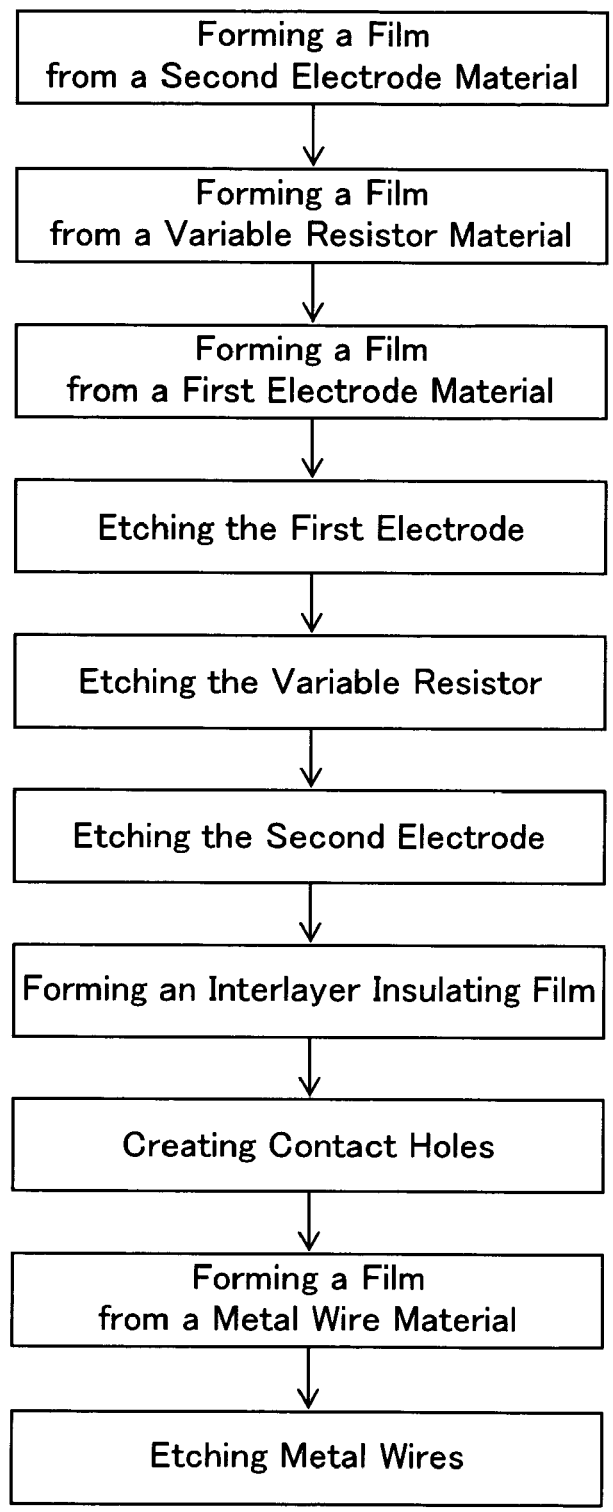
FIG. 13 is a is a flow chart showing the steps in the conventional manufacture for the variable resistive element of FIG. 12.
Figure 14:
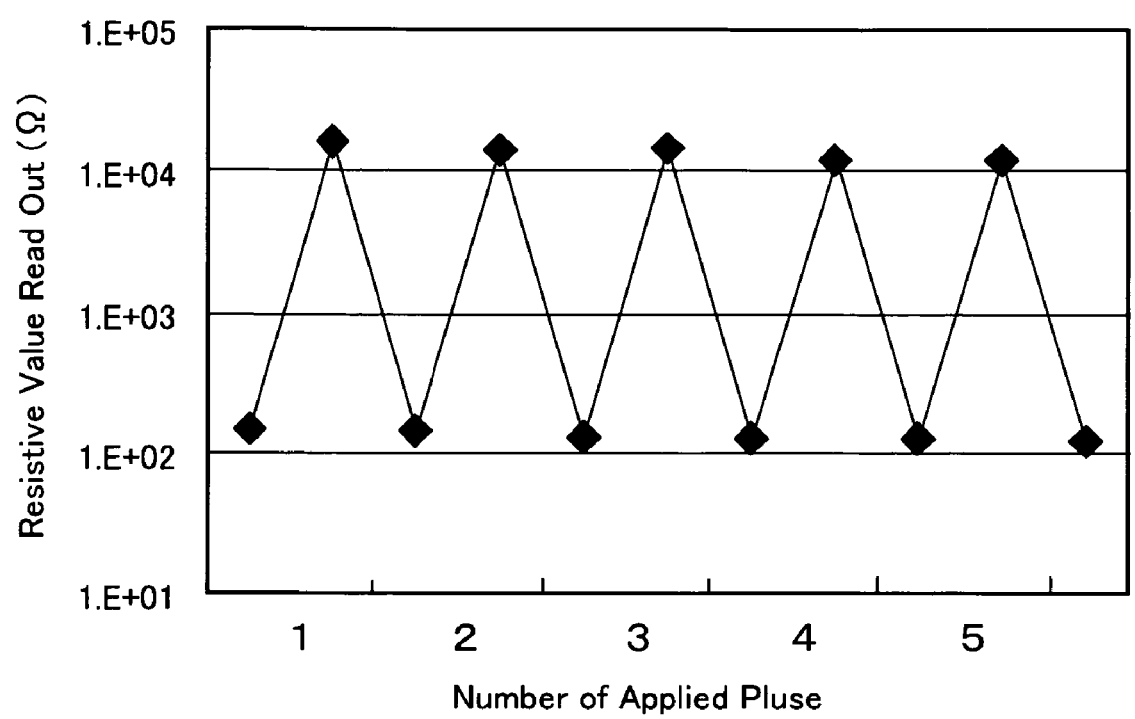
FIG. 14 is a graph showing a change in the resistance resulting from the application of a voltage pulse to the variable resistive element that has been fabricated in accordance with a conventional manufacturing method.

The manufacturing method for a variable resistive element according to an exemplary embodiment is characterized in that the step of carrying out a reduction process on the variable resistor is newly added to the conventional flow of steps for manufacture, as shown in FIG. 13. This step may come at any point after the step of forming a film from a variable resistor material, and in the case of the present embodiment, as shown in FIG. 1, it is possible to add this step as any of the steps (A) to (I). In order to describe in sequence and detail the flow of steps of the manufacturing method for the variable resistive element having the structure of FIG. 12 according to an exemplary embodiment, a case where the "step of carrying out a reduction process" is carried out on the variable resistor as the step (G) in FIG. 1, that is to say, immediately after the "step of creating contact holes" is described below as an example of the manufacturing method of the exemplary embodiment. Here, FIG. 2 schematically shows the flow of steps for manufacture according to the present embodiment.

First, the "step of forming a film from a second electrode material," in which a Pt film, which is an example of the second electrode 1, which is the lower electrode, is deposited on a base substrate (not shown) so as to have a film thickness of 100 nm by a sputtering method, the "step of forming a film from a variable resistor material" in which a PCMO film, which is an example of a variable resistor 2 made of a metal oxide, which is an oxide having a perovskite type structure is deposited so as to have a composition ratio of $Pr_{0.7}Ca_{0.3}MnO_3$ and a film thickness of 100 nm at a temperature for film formation of 500° C. by a sputtering method and the "step of forming a film from a first electrode material," in which a Pt film, which is an example of the first electrode 3, which is the upper electrode, is deposited so as to have a film thickness of 100 nm by a sputtering method, are sequentially carried out.

Next, the "step of etching the first electrode," in which the first electrode 3 is formed by dry etching the Pt film made of the first electrode material using a resist that has been patterned as a mask in accordance with a well-known photolithographic technique, the "step of etching the variable resistor," in which the variable resistor 2 is processed by dry etching the PCMO film made of the variable resistor material using a resist that has been patterned as a mask in accordance with a photolithographic technique, and the "step of etching the second electrode," in which the second electrode 1 is formed by dry etching the Pt film made of the second electrode material using a resist that has been patterned as a mask in accordance with a photolithographic technique, are sequentially carried out.

Next, the "step of forming an interlayer insulating film," in which the interlayer insulating film 4 is deposited is carried out. According to the present embodiment, a silicon oxide film having a film thickness of 500 nm is formed in accordance with a thermal CVD method under normal pressure where vapor deposition is carried out using TEOS (tetraethoxysilane) mixed with ozone and oxygen as the raw material.

Next, the interlayer insulating film 4 is etched using as a mask a resist that has been patterned in accordance with a photolithographic technique, and thereby, the "step of creating contact holes," in which contact holes 5 are formed so as to reach the first electrode 1 or the second electrode 3 is carried out.

Next, the "step of carrying out a reduction process" on the variable resistor, which characterizes the exemplary embodiment, is carried out. The method for this is described in detail in the following.

Next, the "step of forming a film from a metal wire material," in which a film made of a metal wire material for applying a voltage pulse to the first electrode 3 and the second electrode 1 is deposited, is carried out. In the present embodiment, a layered structure (TiN/Al—Si—Cu/TiN film) where a TiN film having a thickness of 50 nm, an Al—Si—Cu film having a thickness of 400 nm, and a TiN film having a thickness of 50 nm are respectively deposited in sequence by a sputtering method is provided.

Next, the "step of etching the metal wires," in which the metal wire material is etched using a resist that has been patterned in accordance with a photolithographic technique as a mask, and thereby, metal wires 6 which are connected to the first electrode 1 or the second electrode 3 via a contact hole 5 are formed, is carried out.

Here, in the above description, general steps, such as the steps of applying a photoresist, the step of exposing the photoresist to light and the step of developing the photoresist, as well as the step of removing the photoresist after etching and the steps of cleaning after etching and removal of the resist, are omitted.

In addition, though the above description of the manufacturing method is based on the flow of steps for manufacture of FIG. 2, where the "step of carrying out a reduction process" on the variable resistor is carried out immediately after the "step of creating contact holes," it is possible to implement a flow of steps for manufacture to which the "step of carrying out a reduction process" on the variable resistor is added as any of the steps (A) to (I) in FIG. 1, excluding the processing step (G), by appropriately rearranging the steps in the above described procedure for manufacture.

In the manufacturing method for a variable resistive element according to the first embodiment, the step of carrying out a reduction process on the variable resistor is carried out in accordance with a method for heat treatment in a hydrogen atmosphere. That is to say, heat treatment is carried out for 1 minute by heating the substrate to a temperature of 350° C. in accordance with a rapid thermal annealing method in a hydrogen atmosphere where a hydrogen gas is diluted with $N_2$ to a concentration of 5%.

Figure 3:
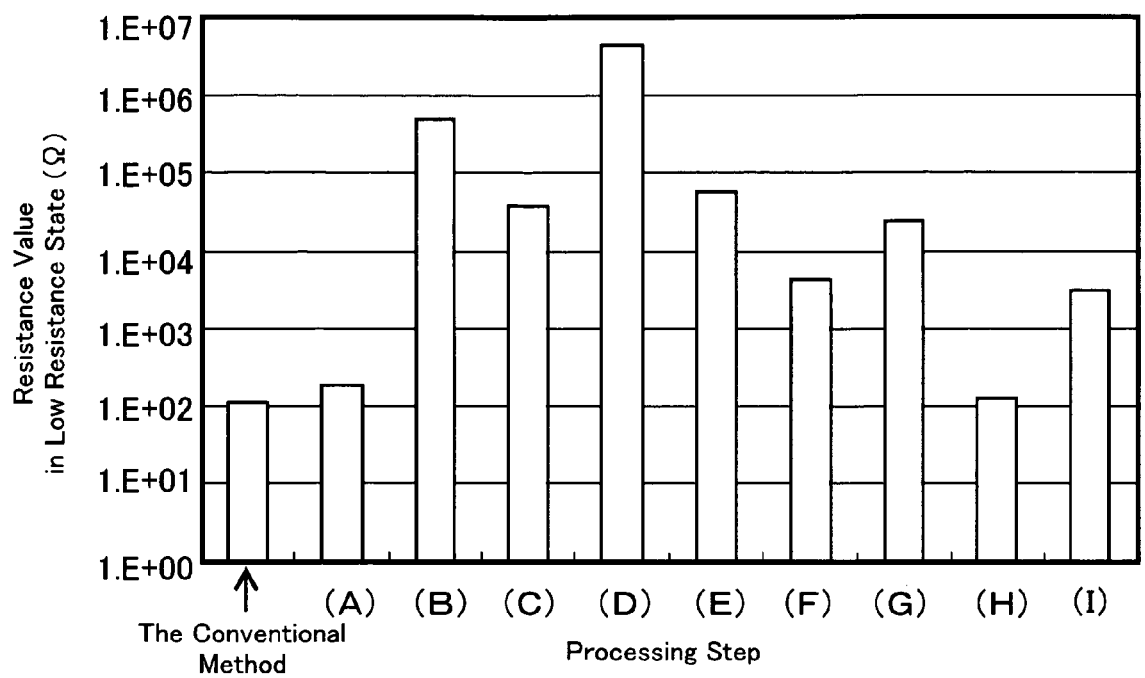
FIG. 3 is a graph showing the resistance value in the low resistance state of a variable resistive element according to the first embodiment for each step of carrying out a reduction process on the variable resistor.

FIG. 3 shows the resistance value of variable resistive elements that have been fabricated by carrying out heat treatment in the step of reduction processing in this hydrogen atmosphere in the low resistance state. The longitudinal axis indicates the resistance value that is read out along the logarithmic scale, and the processing steps (A) to (I) along the lateral axis respectively show in which step from (A) to (I) of FIG. 1 the step of carrying out a reduction process on the variable resistor is. The results in FIG. 3 show that the resistance value differs depending on the flow of steps for manufacture, that is to say, in which step the step of carrying out a reduction process on the variable resistor is. This difference in the resistance value which fluctuates depending on the flow of steps for manufacture can be explained on the basis of the amount of generated hydrogen in atom form which is active in reduction reactions, and particularly in the present embodiment, can be explained on the basis of the existence of a Pt electrode functioning as a hydrogen catalyst.

First, in the processing step (D: immediately after etching of the variable resistor), Pt electrodes (the first electrode 3 and the second electrode 1 before etching) are exposed throughout approximately the entirety of the surface of the substrate. In addition, in the processing step (B: immediately after the film formation from the first electrode material), almost the entirety of the surface of the substrate is covered with Pt (material of the first electrode 3). Therefore, hydrogen molecules in the atmosphere react with the Pt material functioning as a hydrogen catalyst and generate a lot of active hydrogen in atom form, and therefore, the degree of fluctuation in the resistance value is great in comparison with the conventional manufacturing method, and thus, there is an increase by approximately three digits to four digits. Here, it is easy for hydrogen in atom form to transmit through Pt, and therefore, the first electrode 3 does not hinder the reduction reaction with the variable resistor 2.

Subsequently, in the steps (C: immediately after etching of the first electrode), (E: immediately after etching of the second electrode) and (G: immediately after the creation of contact holes), where the exposed area of the Pt material is great, hydrogen molecules in the atmosphere react with the Pt electrodes (mainly the first electrode 3) functioning as a hydrogen catalyst and generate active hydrogen, so that the variable resistor 2 is reduced and the resistance value increases by approximately two digits.

In addition, in the processing steps (F: immediately after the formation of an interlayer insulating film) and (I: immediately after etching of the metal wires), hydrogen molecules that are dispersed in the interlayer insulating film 4 react with the Pt electrodes (mainly the first electrode 3) functioning as a hydrogen catalyst and generate active hydrogen in atom form, and thereby, the variable resistor 2 is reduced so as to increase the resistance value by approximately one digit. Here, it is assumed that the reason why the degree of increase in the resistance is smaller than that in the processing steps (C), (E) and (G) is that the amount of generated hydrogen in atom form is smaller to the extent that hydrogen molecules must diffuse through the interlayer insulating film 4.

Next, in the processing step (A: immediately after the formation of a film from the variable resistor material), a PCMO film (the variable resistor 2) covers almost the entirety of the surface of the substrate, and therefore, no Pt electrodes (the second electrode 1) functioning as a hydrogen catalyst are exposed, and only a small amount of hydrogen in atom form exists, and thus, the fluctuation in the resistance value is small.

In addition, in the processing step (H: immediately after the formation of a film from the metal wire material), a TiN/Al—Si—Cu/TiN film made of the metal wire material of the present embodiment exists on the surface of the substrate, and therefore, change in the resistance value of the variable resistive element is small. This is because the TiN film which covers almost the entirety of the surface of the substrate functions to block hydrogen molecules.

Here, a variable resistive element has exactly the same switching ratio, approximately 100, as that made in accordance with the conventional manufacturing method, no matter in which step the reduction process is carried out. That is to say, the resistance value fluctuates with the same ratio for all variable resistive elements between the low resistance state and the high resistance state.

As described above, it was found by the Applicants through diligent research that the resistance value of variable resistive elements fluctuates when there is active hydrogen in atom form. A manufacturing method where the resistance value can be controlled can be provided as in the below described examples using this phenomenon.

In the case of the above described nonvolatile memory A that can operate when the resistance value of the variable resistive element in the low resistance state is within a range from $10^3\Omega$ to $10^5\Omega$, for example, an operable variable resistive element can be provided by carrying out the step of reduction processing on the variable resistor in accordance with the method of heat treatment in the above described hydrogen atmosphere in each of steps (C), (E), (F), (G) and (I) in the manufacturing method of the present embodiment as shown in FIG. 3. In particular, a resistance value of $10^4\Omega$ is more desirable, and therefore, having the reduction process in the step (G) makes for the optimal flow of steps for manufacture in this case.

Here, though some processing steps cannot provide a variable resistive element which is satisfactory for the nonvolatile memory A, provision of a satisfactory variable resistive element can be made possible in accordance with the following technique.

Figure 4:
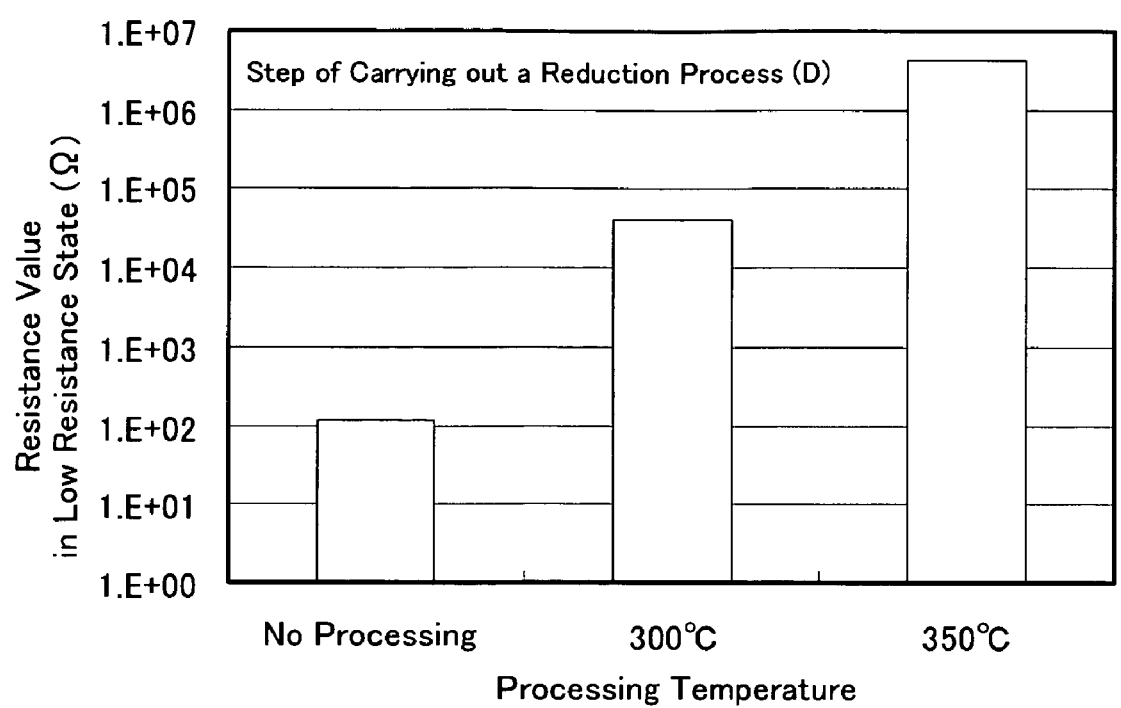
FIG. 4 is a graph showing the resistance value in the low resistance state of the variable resistive element according to the first embodiment using the temperature for heating a substrate at the time of processing in a hydrogen atmosphere as a parameter.

In the processing step (D), for example, though the resistance value is approximately $4\times10^6\Omega$, which is too high, increasing fluctuation in the resistance value is suppressed by approximately two digits, as shown in FIG. 4, by lowering the temperature for heating the substrate, which is a temperature for processing from 350° C. to 300° C., making it possible to apply the variable resistive element to the nonvolatile memory A. As described above, the step of carrying out a reduction process on the variable resistor in accordance with a method for heat treatment in a hydrogen atmosphere depends on the temperature for processing, and therefore, it is possible to optimally control the resistance value by adjusting the temperature for processing.

Though it is preferable in the above described nonvolatile memory A for the resistance value of the variable resistive element in the low resistance state to be within a range from $10^3\Omega$ to $10^5\Omega$ during the operation, from the point of view of easy use, the variable resistive element may be operated within a wider or narrower range than the above described range, depending on the matching with the peripheral circuit and the required properties. Next, a case is assumed where a variable resistive element is applied to a nonvolatile memory which operates when the resistance value of the variable resistive element in the low resistance state is in a range from $10^3\Omega$ to $10^4\Omega$ (hereinafter, this nonvolatile memory is referred to as "nonvolatile memory B") as another example. This nonvolatile memory B is used, for example, in the case where a sense amplifier circuit of which the performance is inferior to that of the nonvolatile memory A is adopted, as well as in the case where a greater value is set for the readout current in order to apply the variable resistive element to a product where high reliability is required in spite of using the same circuit as that of the nonvolatile memory A.

With respect to the nonvolatile memory B, in the manufacturing method according to the present embodiment shown in FIG. 3, a reduction process is carried out on the variable resistor in the steps (F) and (I) in accordance with a method for heat treatment in said hydrogen atmosphere, and thereby, an operable variable resistive element can be provided.

Here, though some processing steps cannot provide a variable resistive element which is satisfactory for the nonvolatile memory B, provision of a satisfactory variable resistive element can be made possible in accordance with the following technique.

Figure 5:
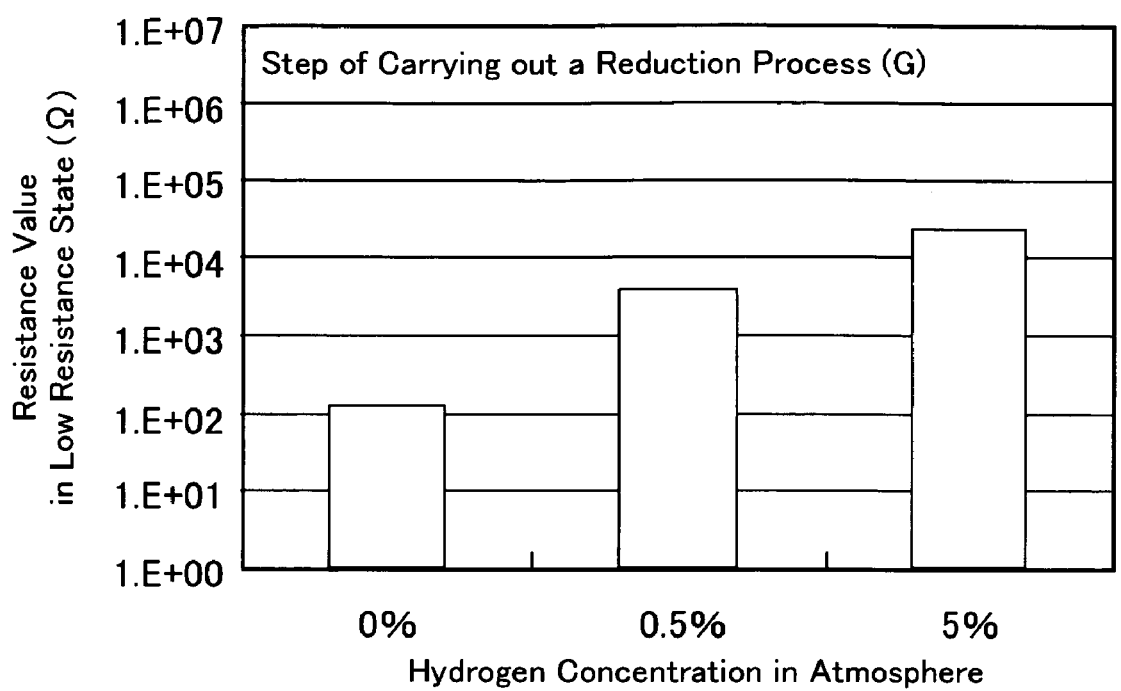
FIG. 5 is a graph showing the resistance value in the low resistance state of the variable resistive element according to the first embodiment using the hydrogen concentration in the atmosphere for processing, which is a hydrogen atmosphere, as a parameter.

In the processing step (G), for example, though the resistive value is approximately $3 \times 10^4\Omega$, which is too high, fluctuation in the resistance value can be suppressed by approximately one digit, as shown in FIG. 5, by lowering the concentration of distilled hydrogen in the processing atmosphere from 5% to 0.5%, making it possible to apply the variable resistive element to the nonvolatile memory B. As described above, the step of carrying out a reduction process on the variable resistor in accordance with a method for heat treatment in a hydrogen atmosphere depends on the concentration of hydrogen, and therefore, it is possible to optimally control the resistance value by adjusting the concentration of hydrogen in the processing atmosphere.

As described above, the resistance value of the variable resistive element may fluctuate depending on whether or not there is active hydrogen in atom form, and therefore, the resistance value, which is too low in accordance with the conventional manufacturing method, can be increased in the step of carrying out a reduction process on the variable resistor in accordance with a method for heat treatment in a hydrogen atmosphere. In addition, in accordance with a method for heat treatment in the hydrogen atmosphere, it is possible to control the resistance value to a desired value by appropriately adjusting the applied steps, the temperature for processing, the concentration of hydrogen and the time for processing, or the combination of these.

Second Embodiment

Figure 6:
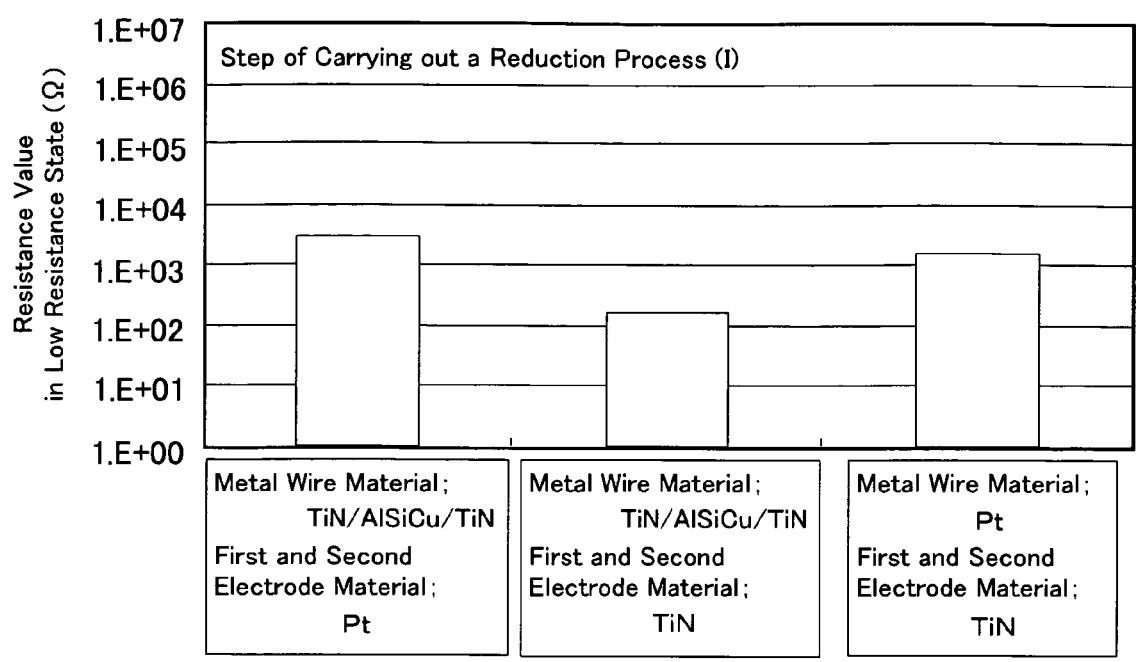
FIG. 6 is a graph showing the resistance value in the low resistance state of the variable resistive element according to the second embodiment for each type of material; the metal wire, and the first and second electrodes.

During the process in the step (I) of FIG. 3, according to the first embodiment, the resistance value increases to $3 \times 10^3\Omega$ in the presence of Pt electrodes (mainly the first electrode 3). In contrast, the resistance value of a variable resistive element that has been fabricated by replacing the material for the first electrode 3 and the second electrode 1 from Pt to TiN is, as shown in FIG. 6, approximately $1.3 \times 10^2\Omega$, which is not very different from that of the variable resistive element that has been made in accordance with the conventional manufacturing method. This is because TiN is a material having a weak hydrogen catalyst effect.

Therefore, according to the second embodiment, the metal wires 6 are formed of a material functioning as a hydrogen catalyst so that the resistance value can be controlled even when the electrode material has a weak hydrogen catalyst effect.

In the present embodiment, a variable resistive element is fabricated by replacing the metal wire material, which is a TiN/Al—Si—Cu—/TiN film in the first embodiment, with a Pt film functioning as a hydrogen catalyst that has been formed by a sputtering method so as to have a film thickness of 500 nm. FIG. 6 shows the resistance value of a variable resistive element having this structure where heat treatment is carried out in an atmosphere of a hydrogen gas that is diluted with $N_2$ in the step of carrying out a reduction process on the variable resistor in the step (I). The metal wires 6 are made of a material functioning as a hydrogen catalyst, and thereby, the resistance value increases by approximately 1 digit (to approximately $1.5 \times 10^3\Omega$) even when an electrode material having a weak hydrogen catalyst effect is used, and it becomes possible to apply the variable resistive element to the nonvolatile memory A.

Here, though in the above described second embodiment the entire material for the metal wires is a Pt film, the exemplary embodiment is not limited to this. A material functioning as a hydrogen catalyst may be used only as a portion of the metal wire material as in the structure of, for example, a Pt/Al—Si—Cu/TiN film.

In addition, though in the above described second embodiment the first electrode 3 and the second electrode 1 are made of a material having a weak hydrogen catalyst effect, this may be replaced with an electrode material functioning as a hydrogen catalyst, and thereby, together with the effects of the metal wires 6, the resistance may be more greatly increased under control.

According to the above described second embodiment, the freedom for selecting an electrode material is wide.

Third Embodiment

During the process in the step (F) of FIG. 3, according to the first embodiment, the resistance value increases to $4 \times 10^3\Omega$ in the presence of Pt electrodes (mainly the first electrode 3). In contrast, the resistance value of a variable resistive element that has been fabricated by replacing the material for the first electrode 3 and the second electrode 1 from Pt to TiN is, as shown in FIG. 8, approximately $1.6 \times 10^2\Omega$, which is not very different from that of the variable resistive element that has been made in accordance with the conventional manufacturing method, because TiN is a material having a weak hydrogen catalyst effect.

Therefore, according to the third embodiment, a material functioning as a catalyst is intentionally placed on the substrate so that the resistance value can be controlled even when the electrode material has a weak hydrogen catalyst effect.

Figure 7:
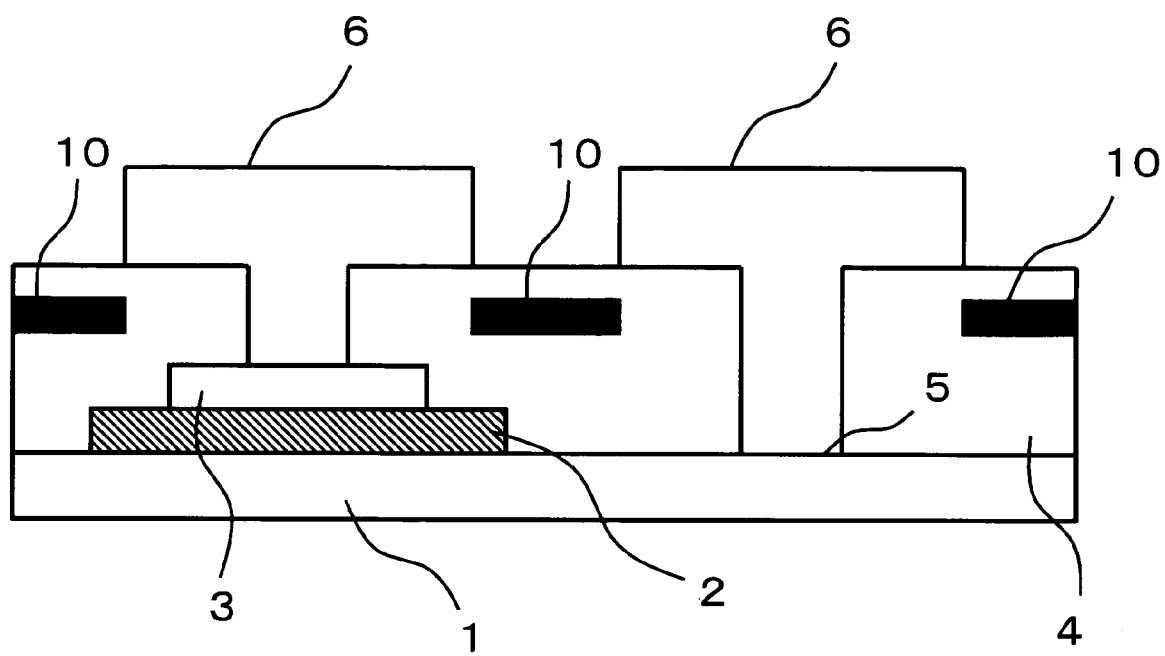
FIG. 7 is a schematic cross sectional diagram showing a variable resistive element according to the third embodiment.

According to an exemplary embodiment, as shown in FIG. 7, a Pt film 10, which is an example of a material functioning as a hydrogen catalyst, is placed in an interlayer insulating film 4 between a first electrode 1 and a metal wire 6. This structure is obtained by, for example, dividing the formation of the interlayer insulating film 4 into two steps and forming the Pt film 10 between the two steps of the formation of the interlayer insulating film. That is to say, the first electrode 3, the variable resistor 2 and the second electrode 1 are sequentially processed in the same procedure as that of the first embodiment, and after that, the first formation of a silicon oxide film having a film thickness of 250 nm from the material for the interlayer insulating film 4, is carried out in accordance with a thermal CVD method under normal pressure. Subsequently, the Pt film, having a thickness of 50 nm that has been formed by a sputtering method, is etched to a desired form using a resist that has been patterned in accordance with a photolithographic technique as a mask. After that, the second formation of a silicon oxide film having a film thickness of 250 nm from the material for the remaining interlayer insulating film 4, is carried out in accordance with a CVD method under normal pressure. Then, contact holes 5 are created, and the metal wires 6 are formed in the same procedure as that of the first embodiment, and thereby, a variable resistive element having the structure of FIG. 7 can be fabricated.

Figure 8:
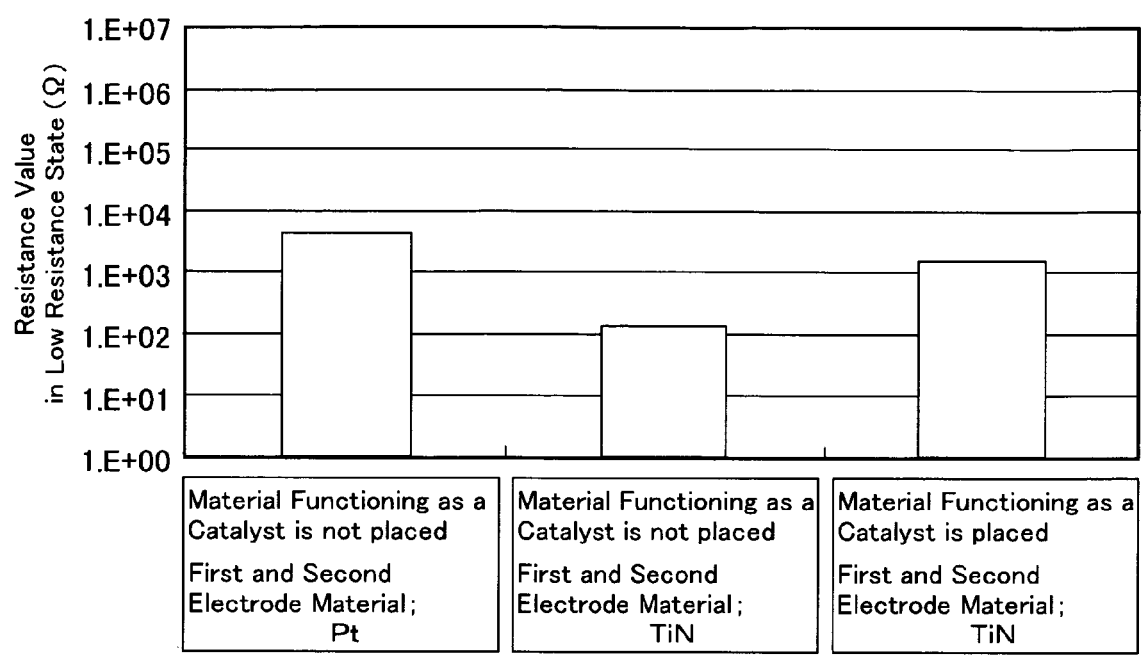
FIG. 8 is a graph showing the resistance value of the variable resistive element according to the third embodiment in the low resistance state for each case where a material functioning as a catalyst exists or not, and for the type of material; the first and second electrodes.

FIG. 8 shows the resistance value of a variable resistive element having the above described structure where heat treatment is carried out in a hydrogen atmosphere in the step of carrying out a reduction process on the variable resistor in the step (F). The resistance value increases by approximately 1 digit (to approximately $1.5 \times 10^3 \Omega$) by providing a Pt film 10 even when the electrode material has a weak hydrogen catalyst effect, and it becomes possible to apply the variable resistive element to the nonvolatile memory A.

Here, though according to the above described third embodiment the material 10 functioning as a hydrogen catalyst is placed in the interlayer insulating film 4 between a first electrode 3 and a metal wire 6, the exemplary embodiment is not limited to this. The material having a predetermined size and functioning as a hydrogen catalyst may be provided beneath the second electrode 1, for example, and after that, a structure of the first electrode 3/variable resistor 2/second electrode 1 may be formed. In this case, the step of a reduction process may be carried out as the step before the step (F).

In addition, though in the above described third embodiment the material for the first electrode 3 and the second electrode 1 has a weak hydrogen catalyst effect, this may be replaced with an electrode material functioning as a hydrogen catalyst, and thereby, together with the effects of the material 10 functioning as a hydrogen catalyst, the resistance may be more greatly increased under control.

According to the above described third embodiment, the freedom for selecting an electrode material is wide.

Fourth Embodiment

A feature of the manufacturing method for a variable resistive element, according to the fourth embodiment, is to make the resistance value controllable even when the electrode material has a weak hydrogen catalyst effect in the same manner as in the third embodiment, and according to this manufacturing method, a material functioning as a hydrogen catalyst is formed on a substrate, and then, a reduction process step is carried out on the variable resistor, and after that, this material functioning as a hydrogen catalyst is removed.

As described in the third embodiment, the resistance value of the variable resistive element, which has been fabricated by replacing the material for the first electrode 3 and the second electrode 1 from Pt to TiN and processed in the step (F) of FIG. 3 according to the first embodiment, is not very different from that of the resistance value that is made in accordance with the conventional manufacturing method.

Figure 9:
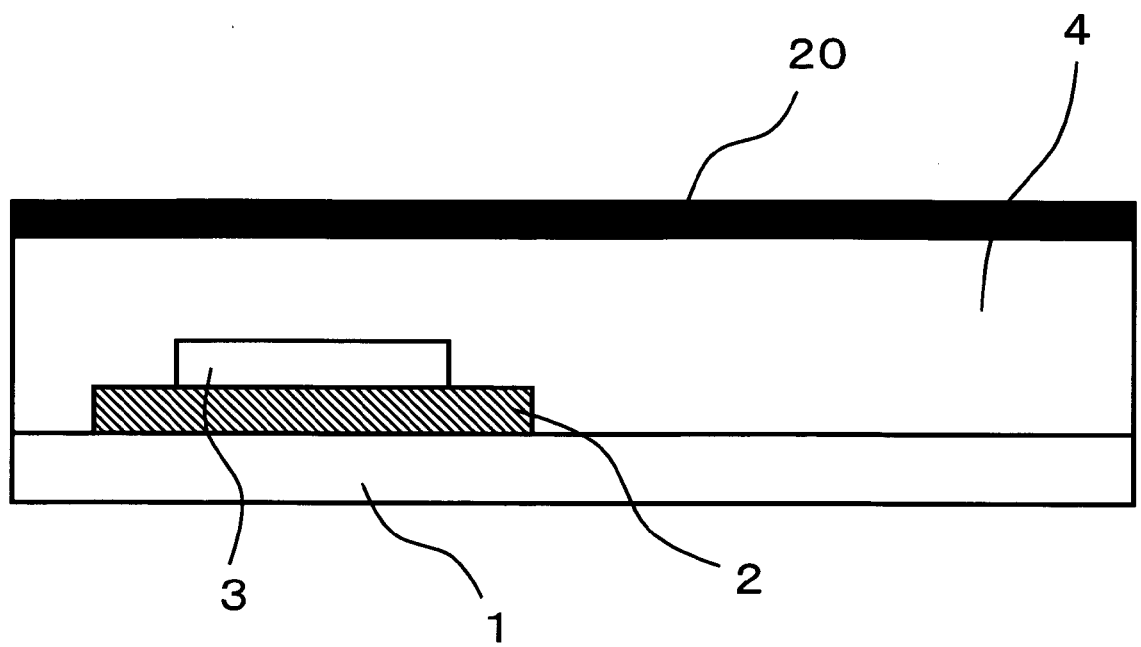
FIG. 9 is a schematic cross sectional diagram showing a variable resistive element according to the fourth embodiment.

According to the fourth embodiment, as shown in FIG. 9, a Pt film 20 having a film thickness of 50 nm, which is a material functioning as a hydrogen catalyst, is formed on the interlayer insulating film 4 by a sputtering method, and heat treatment is carried out in a hydrogen atmosphere in the step (F) after the step of forming an interlayer insulating film. After that, the Pt film 20 is etched and completely removed. The resistance value of the variable resistive element that has been fabricated in accordance with this manufacturing method increases by approximately 2 digits even in the case where an electrode material having a weak hydrogen catalyst effect is used, and thus, it becomes possible to apply the variable resistive element to the nonvolatile memory A.

Here, though in the above described fourth embodiment the material for the first electrode 3 and the second electrode 1 has a weak hydrogen catalyst effect, this may be replaced with a material functioning as a hydrogen catalyst, and the resistance may be more greatly increased under control.

In addition, though in the above described fourth embodiment the material 20 having a hydrogen catalyst effect is formed on a substrate having a variable resistor 2, that is to say, a substrate on which a variable resistive element is intended to be fabricated, the exemplary embodiment is not limited to this. A substrate, where a material having a hydrogen catalyst effect such as Pt is formed on the surface, is prepared separately, for example, and this is processed simultaneously with a substrate having a variable resistor 2 in a diffusion furnace or the like for carrying out the step of heat treatment in a hydrogen atmosphere, and thereby, the same effects can be obtained. In this case, it becomes unnecessary to etch and remove the material 20 having a hydrogen catalyst effect that has been formed as a film on the substrate. In addition, though the fluctuation in the resistance is small during the reduction process in the step (A) of the first embodiment, it becomes possible to make the resistance value fluctuate under control in the step (A) according to the above described method.

Though in the above described first to fourth embodiments, heat treatment is carried out in a hydrogen atmosphere where a hydrogen gas is diluted with $N_2$, the exemplary embodiment is not limited to this. In another example where processing is carried out in a gas that includes hydrogen atoms, such as, for example, an ammonia gas or a hydrochloric gas, the same effects can be obtained.

In addition, though in the above described first to fourth embodiments, a reduction process is carried out on the variable resistor in accordance with a method for heat treatment in a hydrogen atmosphere, the exemplary embodiment is not limited to this. In another example, hydrogen in atom form may be generated through optimal decomposition through irradiation with vacuum ultraviolet light. In this example, active hydrogen in atom form is generated through an optical decomposition reaction in an ammonia gas atmosphere caused by ultraviolet rays having a wavelength of approximately 120 nm to 190 nm using a deuterium lamp as a light source. In addition, in another example, hydrogen in atom form may be generated through thermal decomposition by means of microwaves. In this example, active hydrogen in atom form is generated by means of plasma discharge caused by microwaves in a hydrogen atmosphere that is diluted with $N_2$.

Figure 10:
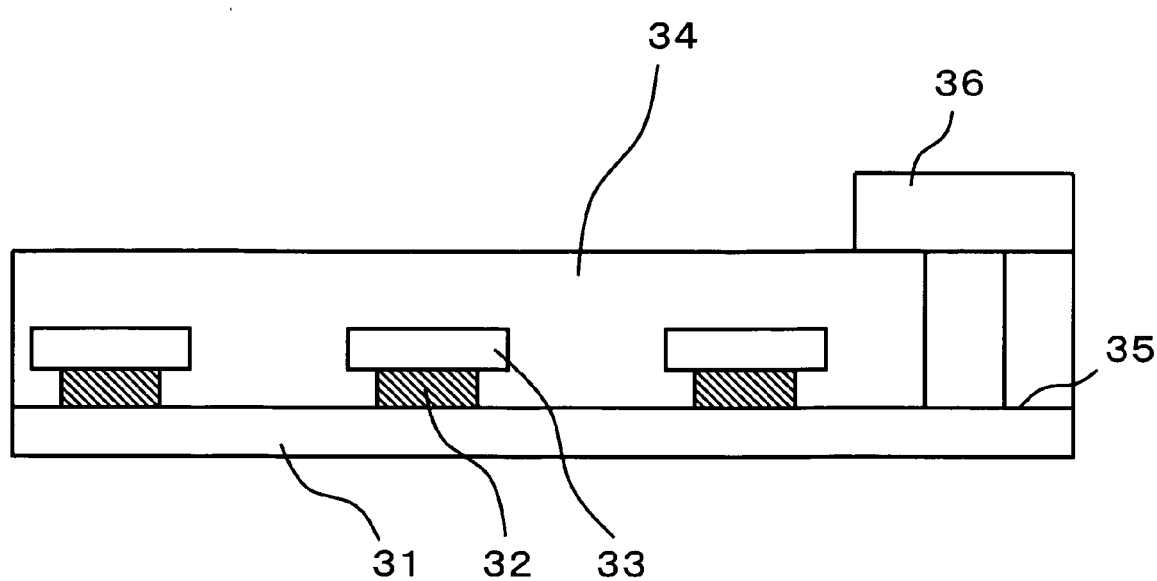
FIG. 10 is a perspective diagram showing the structure of another example of a variable resistive element.
Figure 11:
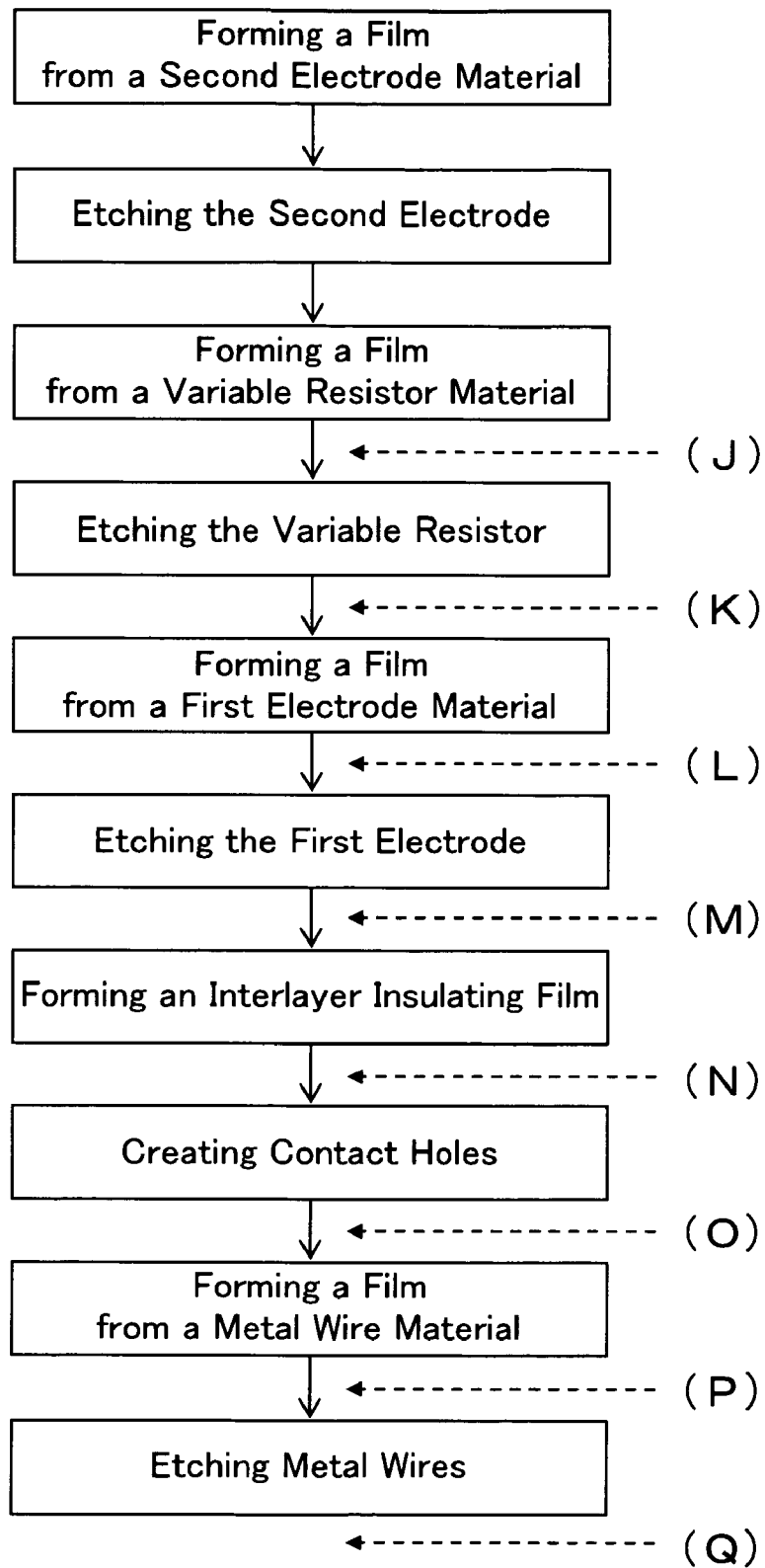
FIG. 11 is a flow chart showing the steps in the manufacture of the variable resistive element of FIG. 10 in accordance with the embodiment.

In addition, though in the above described first to fourth embodiments, the structure of FIG. 12 is described following the flow of steps for manufacture of FIG. 1, the exemplary embodiment is not limited to this, and the variable resistive element may have any structure formed in accordance with a manufacturing method where a reduction process is carried out on the variable resistor in the step after the formation of a film from the variable resistor material. In another example, the manufacturing method according to the exemplary embodiment may be applied to a variable resistive element having, for example, a so-called cross point structure, as shown in FIG. 10. In this structure, variable resistors 32 are placed in portions where wires for a number of second electrodes 31, which are lower electrodes (not shown), and wires for a number of first electrodes 33 which are upper electrodes cross perpendicular to each other, and contact holes 35 are created in the interlayer insulating film 34 at the ends of respective wires for the first electrodes 33 and the second electrodes 31, and then, metal wires 36 are provided (contact holes 35 and metal wires 36 for the first electrodes 33 are not shown). FIG. 11 is a flow chart schematically showing the manufacturing steps for fabricating a variable resistive element having this structure. The flow of steps for manufacture of this variable resistive element is different from that of the variable resistive element of FIG. 12, where the etching steps are carried out in the order of first electrodes 3, variable resistors 2 and second electrodes 1, in that the etching steps are carried out in the order of second electrodes 31, variable resistors 32 and first electrodes 33. A reduction process, which characterized the present invention, may be carried out on the variable resistor in any of the steps from (J) to (Q) after the formation of a film from the variable resistor material, and it is possible to control the resistance value of the variable resistive element in accordance with the same technique as that of the first to fourth embodiments.

Though in the above described embodiments, the description of selected transistors, transistors in the peripheral circuit and multilayered metal wires of the base substrate which are required to fabricate a nonvolatile memory is omitted, since these are well-known technologies, the effectiveness of the exemplary embodiment is not lost, even when combined with these.

In addition, though it is preferable to apply the variable resistive element according to the manufacturing method of the exemplary embodiment to a nonvolatile memory, it may be applied to a volatile memory, such as a DRAM.

In addition, though in the above described first to fourth embodiments, Pt is used as the material functioning as a hydrogen catalyst, the invention is not limited to this. For example, a material made of transition metal atoms, such as Ru, Rh, Pd, Ag, Os, Ir, Au, Mg, Ni, Cr, W or Ta may be used. From these, so-called platinum group elements, Pt, Ir, Os, Ru, Rh and Pd are more desirable, because they function as a strong catalyst.

In addition, as the variable resistors 2 and 32, perovskite-type oxides which can be expressed as the chemical formula "$ABO_3$" and of which typical examples are lead titanate (Pb-$TiO_3$) and barium titanate (Ba$TiO_3$), can be used. Pr and Mn based perovskite-type oxides, for example, can be expressed as the above described chemical formula "$ABO_3$" in the case where "A" is partially or entirely replaced with Pr and "B" is partially or entirely replaced with Mn, providing, for example, a simple formula $Pr_XA_{1-X}MnO_3$ ($0 \leq X \leq 1$) and a formula $(Pr_XA_{1-X})(Mn_YB_{1-Y})O_3$ ($0 \leq X \leq 1, 0 \leq Y < 1$), where a greater number of atoms are replaced with A or B. At least one type of element selected from Ca, La, Sr, Gd, Nd, Bi and Ce can be used as A, and at least one type of element selected from Ta, Ti, Cu, Cr, Co, Fe, Ni and Ga can be used as B. (Pr, Ca)$MnO_3$, Sr$TiO_3$, (Ba, Sr)$TiO_3$, La$MnO_3$, La$TiO_3$, (Nd, Sr)$MnO_3$, (La, Sr)$MnO_3$ and the like can be cited as typical oxides having a perovskite-type structure to become the variable resistors 2 and 32.

These types of materials exhibit a phenomenon where the electrical resistance varies as a result of application of a voltage pulse, and from these, $Pr_{1-X}Ca_XMnO_3$ based materials (PCMO films) exhibit greater change in the resistance value resulting from a voltage pulse, and furthermore, a composition where X is close to 0.3 can provide variable resistors 2 and 32 which are preferable in the present invention.

In addition, ZnSe—Ge hetero structures or oxides of a metal, such as Ti, Nb, Hf, Zr, Ta, Ni, V, Zn, Sn, In, Th or Al, can be used as the variable resistor 2, even though the change in the electrical resistance is smaller than that of the perovskite type structure.

In addition, it is preferable to use a single precious metal in the platinum group metals, of which typical examples are Pt, Ir, Ph and Pd, an alloy of which the base is a precious metal, an oxide conductor made of Ir, Ru, Re or Os, or an oxide conductor, such as SRO (Sr$RuO_3$), LSCO ((LaSr)$CoO_3$) or YBCO (Yb$Ba_2Cu_3O_7$), which have excellent lattice matching with perovskite type oxides, high conductivity and high resistance to oxidation, as the second electrodes 1 and 31 which become the lower electrodes.

Here, it is appropriate to insert an adhesive layer or a barrier layer for improving adhesion and preventing reaction between the lower electrodes 1, 31 and the base substrate. In the case where the lower electrode 1 or 31 is formed on a BPSG film or a silicon oxide film, for example, it is effective to insert Ti, $TiO_X$, $Al_XO_Y$ or the like. In addition, in the case where an electrical connection is secured between the substrate and the lower electrode using a silicon substrate, significant conversion to an alloy occurs between Pt and Si or between Pt and tungsten plugs, or an oxidation reaction occurs in the interface, and therefore, it is effective to insert Ti, TiN, $Ti_{1-X}Al_XN$, TaN, TiSiN, TaSiN or the like having conductivity and barrier properties between the lower electrode 1 or 31 and the Si substrate, or between the lower electrode and the tungsten plug.

Meanwhile, the first electrodes 3 and 33 which become the upper electrodes are not necessarily exposed to an oxygen atmosphere at a high temperature, and therefore, they are not limited to precious metal elements, such as Pt, Ir, Ru and the like, as described above, and various materials, such as metals including Ag, Al, Cu, Ni, Ti and Ta, and oxide conductors can be applied.

Although the exemplary embodiment has been described in terms of the preferred embodiments, it will be appreciated that various modifications and alterations might be made by those skilled in the art without departing from the spirit and scope of the exemplary embodiment. The exemplary embodiment should therefore be measured in terms of the claims which follow.

What is claimed is:

1. A manufacturing method for a variable resistive element comprising a variable resistor comprising a variable resistor material provided between a first electrode comprising a first electrode material and a second electrode comprising a second electrode material, the electrical resistance of the variable resistor being variable between a low resistance value and a high resistance value by applying a voltage pulse between the first electrode and the second electrode, said method comprising:

carrying out a reduction process on the variable resistor so that the electrical resistance of the variable resistor is increased; wherein carrying out the reduction process comprises carrying out a heat treatment at low temperatures never exceeding 350° C. in a reduction atmosphere including hydrogen, and carrying out the heat treatment comprises providing a material operating as a hydrogen catalyst, and the variable resistor comprises an oxide having a perovskite structure which is represented by any one of the following general formulas:

$Pr_{1-X}Ca_X[Mn_{1-Z}M_Z]O_3$, wherein M is any element selected from Ta, Ti, Cu, Cr, Co, Fe, Ni and Ga, $La_{1-X}AE_XMnO_3$, wherein AE is any bivalent alkaline earth metal selected from Ca, Sr, Pb and Ba, $RE_{1-x}Sr_xMnO_3$, wherein RE is any trivalent rare earth element selected from Sm, La, Pr, Nd, Gd and Dy,
$La_{1-x}Co_x[Mn_{1-z}Co_z]O_3$,
$Gd_{1-x}Ca_xMnO_3$, and
$Nd_{1-x}Gd_xMnO_3$, wherein $0<X<1$, $0\leq Z<1$.

2. The manufacturing method according to claim 1, wherein a reduction reaction is induced using hydrogen in atom form in carrying out the reduction process on the variable resistor.

3. The manufacturing method according to claim 1, wherein at least either the first electrode or the second electrode comprises the material operating as a hydrogen catalyst.

4. The manufacturing method according to claim 1 including simultaneously carrying out heat treatment on a first semiconductor substrate having at least the variable resistor and a second semiconductor substrate having a material operating as the hydrogen catalyst on its surface in the reduction atmosphere including hydrogen.

5. The manufacturing method according to claim 1, wherein the material operating as a hydrogen catalyst includes at least one metal atom selected from Ru, Rh, Pd, Ag, Os, Ir, Pt, Au, Mg, Ni, Cr, W and Ta.

6. The manufacturing method according to claim 1, wherein the variable resistor comprises an oxide having a perovskite structure which includes at least one element selected from Pr, Ca, La, Sr, Gd, Nd, Bi, Ba, Y, Ce, Pb, Sm and Dy, and at least one type of element selected from Ta, Ti, Cu, Mn, Cr, Co, Fe, Ni and Ga.

7. The manufacturing method according to claim 1, wherein the second electrode includes at least one material from single precious metals in the platinum group metals, alloys of which the base is a precious metal in the platinum group metals, oxide conductors comprising a metal selected from Ir, Ru, Re and Os, and oxide conductors selected from strontium ruthenium oxide (SRO), lanthanum strontium cobalt oxide (LSCO) and yttrium barium copper oxide (YBCO).

8. The manufacturing method according to claim 1, wherein the first electrode includes at least one material from precious metals in the platinum group metals, single metals selected from Ag, Al, Cu, Ni, Ti and Ta or alloys of these, oxide conductors comprising a metal selected from Ir, Ru, Re and Os, and oxide conductors selected from strontium ruthenium oxide (SRO), lanthanum strontium cobalt oxide (LSCO) and yttrium barium copper oxide (YBCO).

9. The manufacturing method according to claim 1 including controlling a resistance value at low resistance state of the electrical resistance between the first electrode and the second electrode by adjusting at least one of temperature, hydrogen concentration, and processing time in the heat treatment carried out in the reduction atmosphere including hydrogen.

10. The manufacturing method according to claim 1, wherein the heat treatment is carried out for about 1 min.

11. The manufacturing method according to claim 1, wherein the method includes:
(1) forming a film from said second electrode material, (2) forming a film from said variable resistor material, and (3) forming a film from said first electrode material, in the order of (1), (2) and (3);
etching the film formed from the first electrode material to form the first electrode, etching the film formed from the variable resistor material to form the variable resistor; and then
carrying out the reduction process; and
etching the film formed from the second electrode material to form the second electrode.

* * * * *